US011991876B2

(12) United States Patent
Pan et al.

(10) Patent No.: US 11,991,876 B2
(45) Date of Patent: May 21, 2024

(54) METHOD FOR FORMING A SEMICONDUCTOR STRUCTURE HAVING SECOND ISOLATION STRUCTURES LOCATED BETWEEN ADJACENT ACTIVE AREAS

(71) Applicant: CHANGXIN MEMORY TECHNOLOGIES, INC., Anhui (CN)

(72) Inventors: Junbo Pan, Hefei (CN); Jinghao Wang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 318 days.

(21) Appl. No.: 17/570,483

(22) Filed: Jan. 7, 2022

(65) Prior Publication Data

US 2023/0008414 A1 Jan. 12, 2023

Related U.S. Application Data

(63) Continuation of application No. PCT/CN2021/117286, filed on Sep. 8, 2021.

(30) Foreign Application Priority Data

Jul. 7, 2021 (CN) .......................... 202110768525.X

(51) Int. Cl.
*H10B 12/00* (2023.01)
(52) U.S. Cl.
CPC ................................. *H10B 12/482* (2023.02)
(58) Field of Classification Search
CPC ... H10B 12/377; H10B 12/482; H10B 12/485

USPC ........................................................ 438/262
See application file for complete search history.

(56) References Cited

U.S. PATENT DOCUMENTS

| 8,476,085 | B1 | 7/2013 | Zhang |
| 8,975,155 | B2 | 3/2015 | Chuang |
| 9,209,243 | B2 | 12/2015 | Chuang |
| 10,868,174 | B1 | 12/2020 | Wu |
| 2007/0232019 | A1 | 10/2007 | Cho |

(Continued)

FOREIGN PATENT DOCUMENTS

| CN | 101047151 A | 10/2007 |
| CN | 102412179 A | 4/2012 |

(Continued)

*Primary Examiner* — Hoai V Pham
(74) *Attorney, Agent, or Firm* — Cooper Legal Group, LLC

(57) ABSTRACT

Provided are a semiconductor structure and a method for forming same. The method includes the following operations. Active areas and first isolation structures disposed at intervals are provided. Second isolation structures located between adjacent active areas are provided, and top surfaces of the second isolation structures are higher than or flush with top surfaces of the active areas. A mask layer are formed, pattern openings of which expose part of the top surfaces of the active areas, and the second isolation structures are located at two opposite sides of part of the active areas. The part of the active areas exposed by the pattern openings and part of the first isolation structures are etched to form intermediate grooves at least exposing part of surfaces of the active areas. Bit line structures are formed, which are electrically connected to top surfaces exposed by the intermediate grooves.

14 Claims, 11 Drawing Sheets

(56) References Cited

U.S. PATENT DOCUMENTS

| | | | |
|---|---|---|---|
| 2013/0189799 A1 | 7/2013 | Zhang | |
| 2015/0014807 A1 | 1/2015 | Chuang et al. | |
| 2015/0155352 A1 | 6/2015 | Chuang et al. | |
| 2020/0395480 A1 | 12/2020 | Wu et al. | |
| 2021/0104631 A1 | 4/2021 | Wu et al. | |
| 2022/0059543 A1* | 2/2022 | Mun | H10B 12/482 |

FOREIGN PATENT DOCUMENTS

| | | |
|---|---|---|
| CN | 104282616 A | 1/2015 |
| CN | 107833872 A | 3/2018 |
| CN | 110634869 A | 12/2019 |
| CN | 111640743 A | 9/2020 |
| CN | 112018080 A | 12/2020 |

\* cited by examiner

METHOD FOR FORMING A SEMICONDUCTOR STRUCTURE HAVING SECOND ISOLATION STRUCTURES LOCATED BETWEEN ADJACENT ACTIVE AREAS

CROSS-REFERENCE TO RELATED APPLICATIONS

The present application is a continuation application of International Application No. PCT/CN2021/117286, filed on Sep. 8, 2021, which claims priority to China Patent Application No. 202110768525.X, filed on Jul. 7, 2021. International Application No. PCT/CN2021/117286 and China Patent Application No. 202110768525.X are hereby incorporated by reference in their entireties.

BACKGROUND

Isolation media such as oxides or nitrides play an extremely vital role in a process of manufacturing a semiconductor chip. For example, a large number of isolation media act as insulation media and sacrificial media. An exposure of a large number of isolation media also brings some inevitable troubles. For example, an etching process of other film layers may cause over-etching of the isolation media, which in turn causes a film thickness of an isolation layer not to meet requirements or even causes mutual crosstalk between conductive components.

SUMMARY

The embodiments of the present disclosure relate to a semiconductor structure and a method for forming same.

In order to solve the above problems, the embodiments of the present disclosure provide a method for forming a semiconductor structure, including the following operations. Active areas and first isolation structures disposed at intervals are provided. Second isolation structures located between adjacent active areas are formed, and top surfaces of the second isolation structures are higher than or flush with top surfaces of the active areas. A mask layer is formed, pattern openings of the mask layer expose part of the top surfaces of the active areas, and the second isolation structures are located at two opposite sides of part of the active areas. The part of the active areas exposed by the pattern openings and part of the first isolation structures are etched to form intermediate grooves. Bit line structures are formed electrically connected to the top surfaces of the active areas exposed by the intermediate grooves.

Correspondingly, the embodiments of the present disclosure further provide a semiconductor structure, including: a base, intermediate grooves, and bit line structures. The base includes active areas, first isolation structures, and second isolation structures. The active areas and the first isolation structures are disposed at intervals, and the second isolation structures are located between adjacent active areas. Top surfaces of the second isolation structures are higher than or flush with top surfaces of the active areas. Intermediate grooves are located in the base. The intermediate grooves at least expose part of surfaces of the active areas. The second isolation structures are located at two opposite sides of the intermediate grooves. The bit line structures are electrically connected to the part of the active areas exposed by the intermediate grooves.

BRIEF DESCRIPTION OF THE DRAWINGS

One or more embodiments are exemplified by the corresponding accompanying drawings. These exemplified descriptions do not constitute limitations to the embodiments. Elements with the same reference numerals in the accompanying drawings are shown as similar elements. The drawings in the accompanying drawings do not constitute scaling restrictions unless otherwise stated.

DETAILED DESCRIPTION

Figure 1:
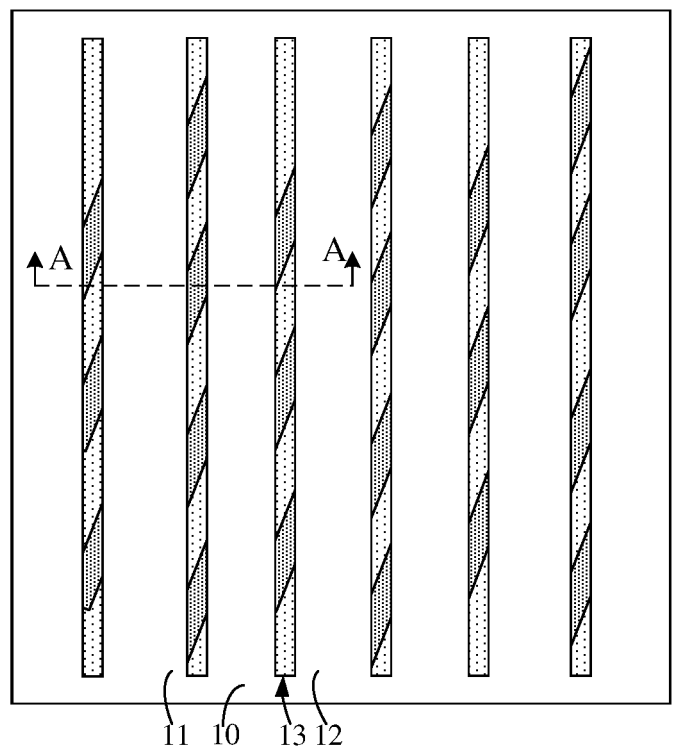
FIG. 1 to FIG. 8 are schematic structural diagrams corresponding to operations of a method for forming a semiconductor structure.
Figure 2:
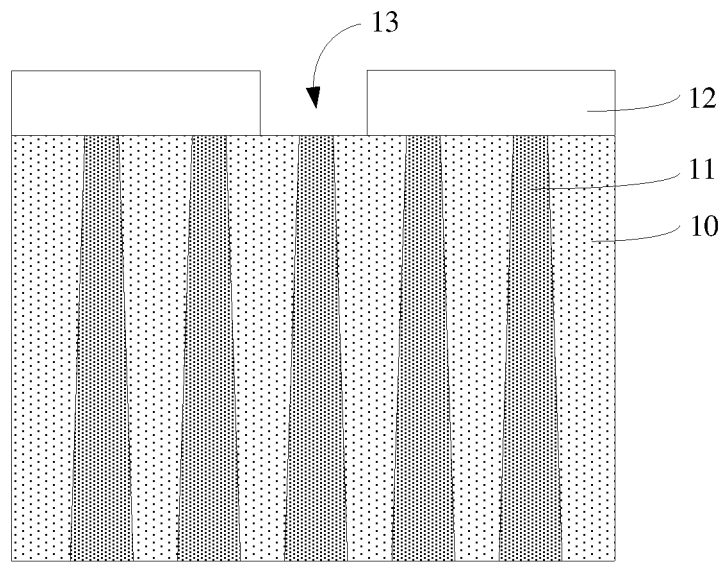
Figure 4:
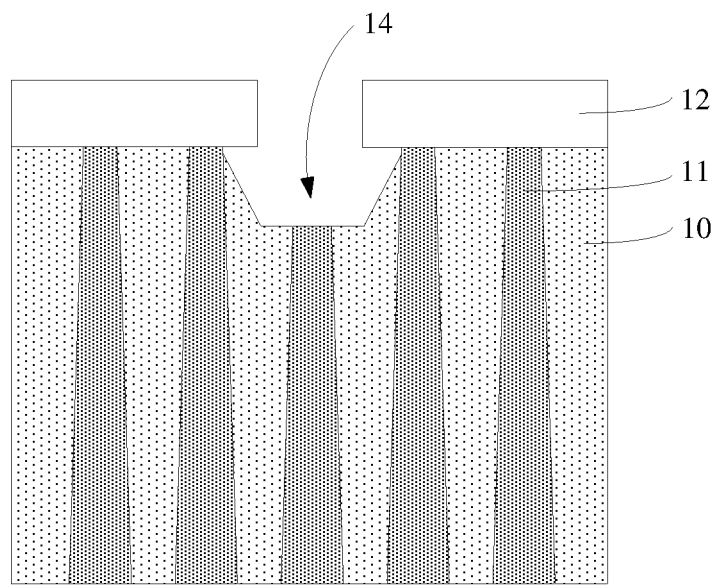
Figure 5:
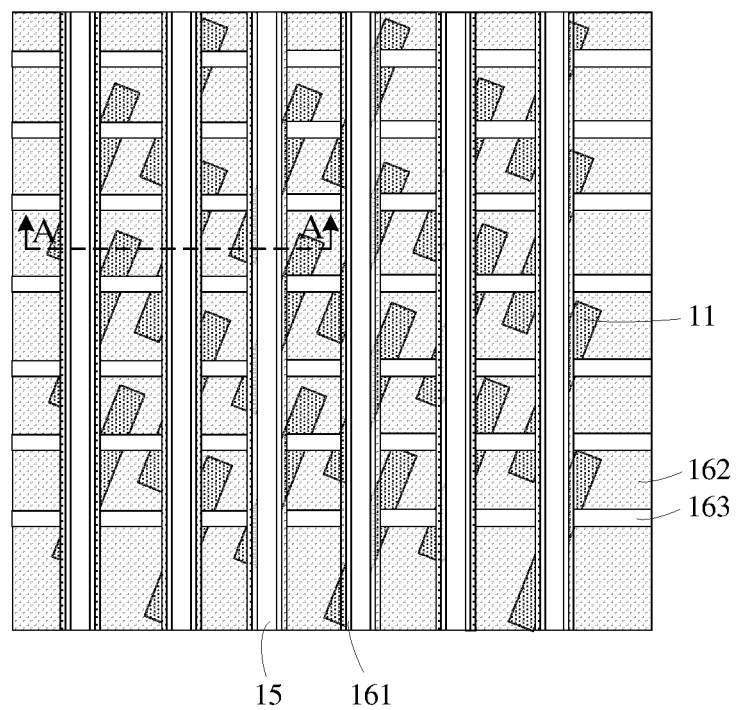
Figure 6:
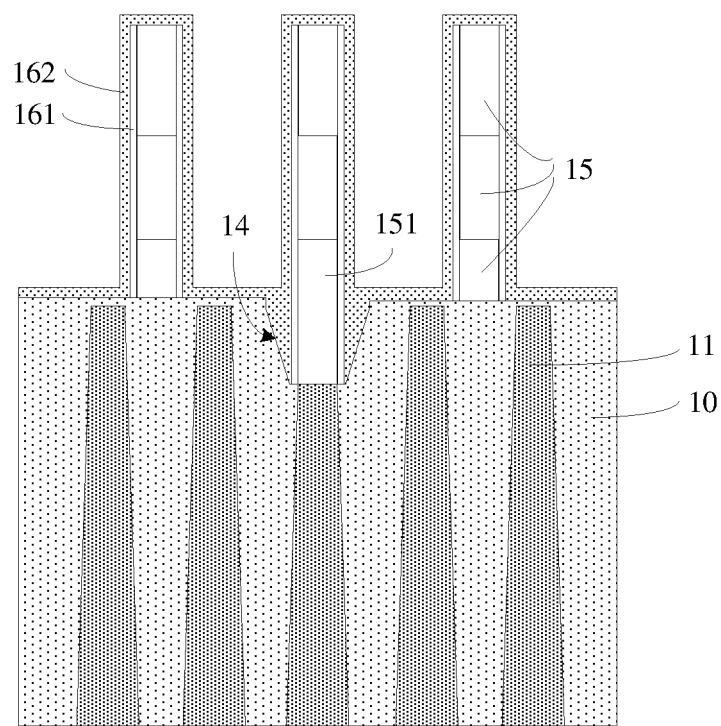

Referring to FIG. 1 to FIG. 8, schematic structural diagrams corresponding to operations of a method for forming a semiconductor structure are illustrated. FIG. 2 is a schematic diagram of a sectional structure of the structure shown in FIG. 1 along a sectional direction AA, and FIG. 6 is a schematic diagram of a sectional structure of the structure shown in FIG. 5 along a sectional direction AA. For the simplicity of the illustrations, FIG. 2 to FIG. 4 only illustrate one pattern opening of a mask layer. Meanwhile, for the simplicity of the expressions, etching gas and an etching agent are collectively referred to as etching component herein.

Referring to FIG. 1 and FIG. 2, active areas 11 and first isolation structures 10 disposed at intervals are provided. The first isolation structures 10 are used to isolate adjacent active areas 11. A mask layer 12 is formed. A pattern opening 13 of the mask layer 12 exposes part of a top surface of the active areas 11.

A material of the first isolation structures 10 is generally silicon dioxide or other low-cost materials to facilitate massive filling. The pattern opening 13 is a strip-type opening. A plurality of pattern openings 13 are arranged in sequence. The pattern openings 13 not only expose part of the top surfaces of the active areas 11, but also expose part of top surfaces of the first isolation structures 10.

Figure 3:
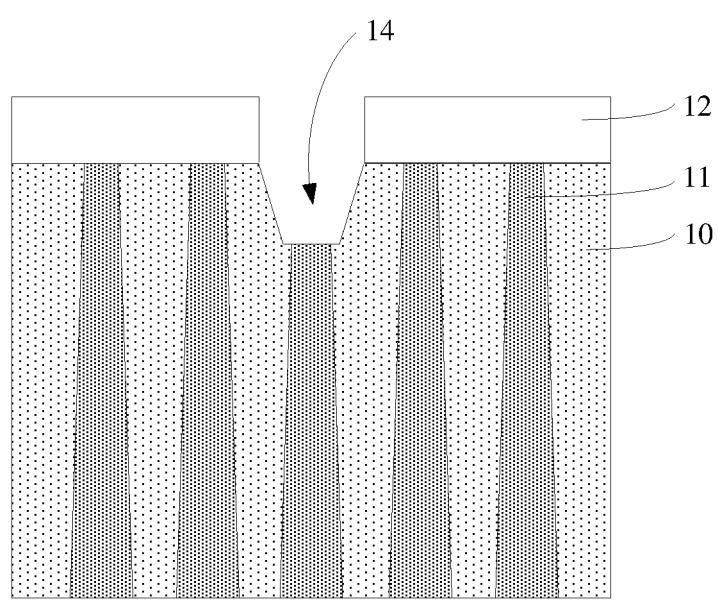

Referring to FIG. 3, the part of the active areas 11 and the part of the first isolation structures 10 exposed by the pattern opening 13 (referring to FIG. 2) are etched to form an intermediate groove 14.

Theoretically, in an arrangement direction of the pattern openings 13, the width of top openings of the intermediate grooves 14 is equal to the width of the pattern openings 13, and the first isolation structures 10 isolate the intermediate grooves 14 from the adjacent active areas 11. However, due to over-etching by an etching component, the width of the top openings of the intermediate grooves 14 may be greater than that of the pattern openings 13, and the intermediate grooves 14 may even expose the adjacent active areas 11. The width of the top openings of the intermediate grooves 14 of the structure shown in FIG. 3 is equal to the width of the pattern openings 13. In addition, in an etching process, due to the consumption of the etching component and the problem of central accumulation, an etching rate gradually decreases, and finally the width of the bottoms of the intermediate grooves 14 is less than the width of the top openings.

Referring to FIG. 4, the intermediate grooves 14 are cleaned.

After the etching process, a cleaning process is required, so as to remove the excess unreacted etching component and corresponding derivatives. The etching component will consume the material of the first isolation structures 10 due to the over-etching, and a detergent of the cleaning process will also consume part of the material of the first isolation structures 10, so that the width of the intermediate grooves 14 is increased.

When the intermediate grooves 14 expose the adjacent active areas 11, subsequent processes may damage the exposed active areas 11. Damage forms include material loss and/or change of the material composition, which will lead to impairments of electrical performance of the semiconductor structure manufactured on the basis of the active areas 11. For example, part of the damaged active areas 11 are used to be connected to capacitor contact holes. Due to the damage of the active areas 11, charging and discharging of capacitors are affected.

Referring to FIG. 5 and FIG. 6, bit line structures 15, first isolation layers 161, a second isolation layer 162 and intermediate sidewalls 163 are formed.

The bit line structures 15 are in contact with the active areas 11 through bit line contacts 151. The first isolation layers 161 cover sidewalls of the bit line structures 15. The second isolation layer 162 covers sidewalls of the first isolation layer 161 and covers the first isolation structures 10 and the exposed top surfaces of the active areas 11. The intermediate sidewalls 163 divide trenches between the adjacent bit line structures 15 into a plurality of contact grooves. Each contact groove corresponds to one active area 11. Each active area 11 is used to be connected to a storage capacitor of a memory.

It should be noted that the width of the top openings of the intermediate grooves 14 is greater than the width of the bottom, and widths of upper and lower parts of the bit line contact 151 are the same, so that the second isolation layer 162 will also fill the intermediate grooves 14. In a direction from the tops of the intermediate grooves 14 to the bottom, the thickness of the second isolation layer 162 located in the intermediate grooves 14 gradually decreases. When the intermediate grooves 14 do not expose the adjacent active areas 11, the second isolation layer 162 is located between the first isolation structures 10 and the first isolation layer 161. A material of the first isolation layer 161 may be the same as the material of the first isolation structures 10, such as silicon dioxide.

Figure 7:
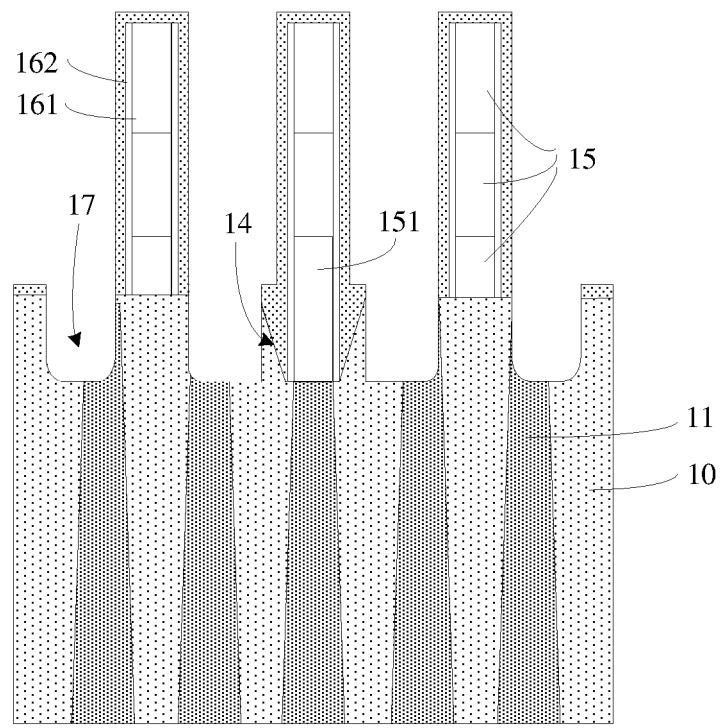

Referring to FIG. 7, part of the second isolation layer, part of the first isolation structures 10, and part of the active areas 11 that are located below the contact groove are sequentially etched, so as to form capacitor contact windows 17 including the contact grooves.

The first isolation structures 10 isolate the capacitor contact windows 17 from the adjacent active areas 11, and the second isolation layer 162 isolates the capacitor contact windows 17 from the adjacent bit line contacts 151.

Figure 8:
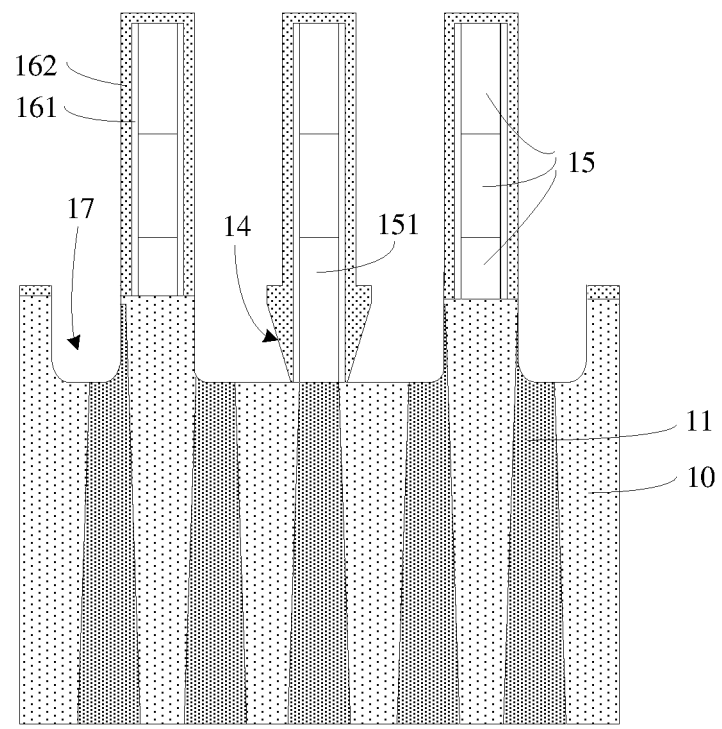

Referring to FIG. 8, the capacitor contact windows 17 are cleaned.

In the process of cleaning the capacitor contact windows 17, the detergent may further consume the second isolation layer 162 and the first isolation structures 10, thereby exposing another adjacent conductive structure. If the capacitor contact windows 17 expose a plurality of conductive structures, during the formation of capacitor contact holes filling the capacitor contact windows 17, the capacitor contact holes will be electrically connected to the plurality of conductive structures, which will in turn cause a signal crosstalk problem. The conductive structures include the active areas 11 and the bit line contacts 151. The detergent possibly consumes the first isolation structures 10 to expose the adjacent active areas 11, or also possibly consumes the second isolation layer 162 to expose the adjacent bit line contacts 151.

It should be noted that both the additional loss caused by the process for cleaning the capacitor contact windows 17 and the over-etching caused by the process for forming the capacitor contact windows 17 may possibly cause the capacitor contact windows 17 to expose another adjacent conductive structure.

In order to make the objectives, the technical solutions and the advantages of the embodiments of the present disclosure clearer, all the embodiments of the present disclosure will be described in detail below in combination with the accompanying drawings. However, those of ordinary skill in the art can understand that in the various embodiments of the present application, many technical details are presented in order to make the present disclosure better understood by readers. However, the technical solutions claimed in the present disclosure can also be implemented without these technical details and various changes and modifications based on the embodiments.

Figure 9:
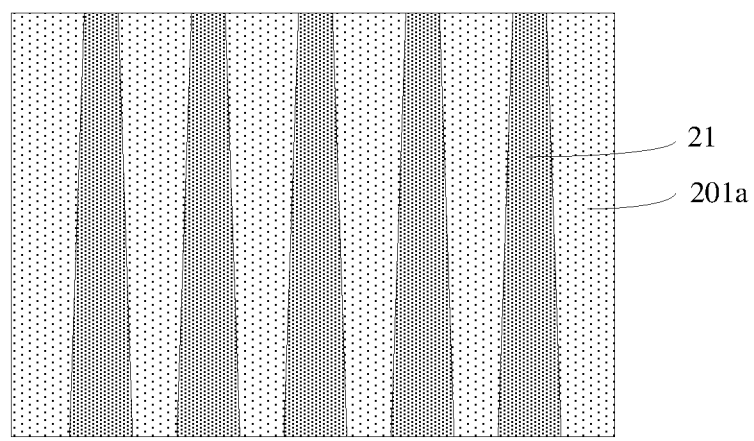
FIG. 9 to FIG. 20 are schematic structural diagrams corresponding to operations of a method for manufacturing a semiconductor structure provided in the embodiments of the present disclosure.

FIG. 9 to FIG. 20 are schematic structural diagrams corresponding to all steps of a method for manufacturing a semiconductor structure provided in the embodiments of the present disclosure. The method for forming the semiconductor structure is specifically as follows:

Referring to FIG. 9, active areas 21 and initial isolation structures 201*a* which are disposed at an interval are formed. Top surfaces of the initial isolation structures 201*a* are flush with top surfaces of the active areas 21. A material of the initial isolation structures 201*a* includes silicon dioxide.

Figure 10:
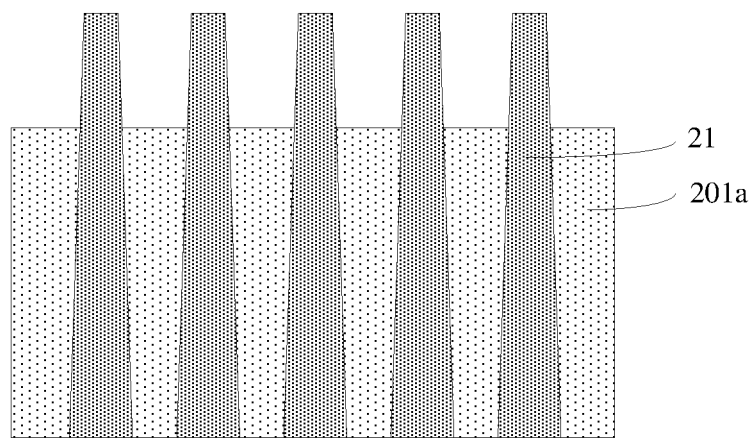

Referring to FIG. 10, the initial isolation structures 201*a* are etched by a partial thickness, and the remaining initial isolation structures 201*a* expose sidewalls of the active areas 21. In a direction perpendicular to the top surfaces of the initial isolation structures 201*a*, the thickness of the etched initial isolation structures 201*a* is related to a thickness of subsequently required second isolation structures. When the desired thickness of the second isolation structures is greater, the thickness of the etched initial isolation structure 201*a* is greater.

Figure 11:
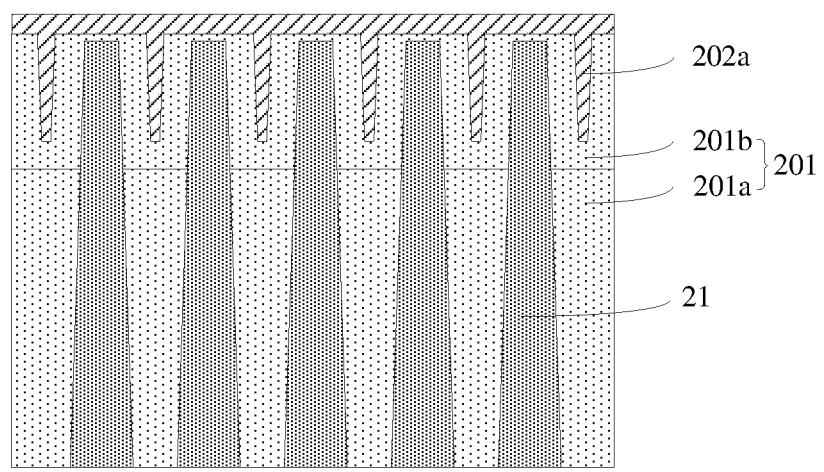

Referring to FIG. 11, a supplementation layer 201*b* and a second isolation film 202*a* are formed.

A maskless deposition process is performed to form the supplementation layer 201*b*. The supplementation layer 201*b* covers the sidewalls and the top surfaces of the active areas 21 and the top surfaces of the remaining initial isolation structures 201*a*. The thickness of the supplementation layer 201*b* is less than ½ of a distance between adjacent active areas 21. In this way, gaps for filling the second isolation structures 202 can be reserved between adjacent active areas 21. The gaps are surrounded by the supplementation layer 201*b*. The initial isolation structure 201*a* and the supplementation layer 201*b* together constitute a first isolation structure 201. The second isolation film 202*a* fills the gaps enclosed by the supplementation layer 201*b* and is located on the top surface of the supplementation layer 201*b*.

A material of the supplementation layer 201*b* may be the same as a material of the initial isolation structure 201*a*, such as silicon dioxide. The hardness of the material of the second isolation film 202*a* may be greater than the hardness of the material of the supplementation layer 201*b*, such as silicon nitride, in order to prevent over-etching of an etching component used to etch the supplementation layer 201*b* and the active areas 21.

Figure 12:
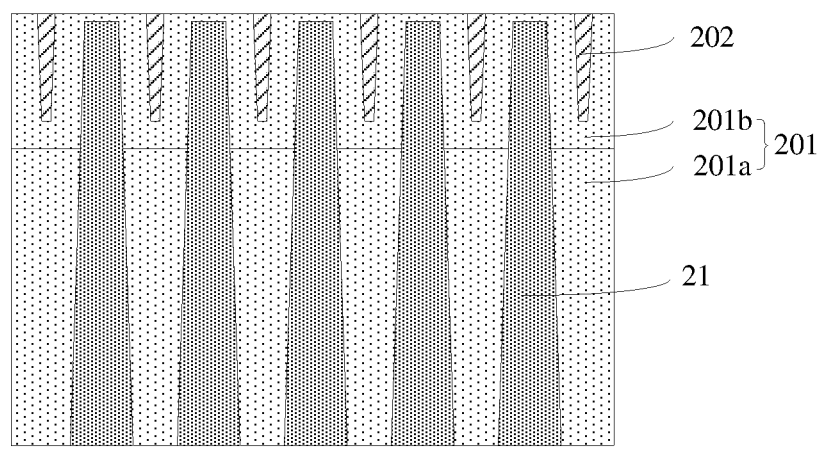

Referring to FIG. 12, a planarization process is performed to remove the second isolation film 202a higher than the top surfaces of the first isolation structures 201 (referring to FIG. 11), and the remaining second isolation film 202a constitutes the second isolation structures 202.

In the present embodiment, the top surfaces of the second isolation structures 202 are flush with the top surfaces of the first isolation structures 201 and are higher than the top surfaces of the active areas 21. The first isolation structures 201 and the second isolation structures 202 together fill gaps between adjacent active areas 21.

It can be known that when a distance between adjacent active areas 21 remains unchanged, in an arrangement direction of the active areas 21, the width of the gaps is related to the thickness of the supplementation layer 201b. If the thickness of the supplementation layer 201b is less, the width of the gaps is greater. Relatively, when the thickness of the supplementation layer 201b remains unchanged, the width of the gaps is related to the distance between the adjacent active areas 21. If the distance between the adjacent active areas 21 is greater, the width of the gaps is greater.

In the present embodiment, in the planarization process, only the second isolation film 202a higher than the top surface of the first isolation structures 201 is etched, and the supplementation layer 201b higher than the top surfaces of the active areas 21 remains. This is beneficial to prevent a polishing device from applying, in the planarization process, a pull stress to the active areas 21, thereby avoiding position shift of the active areas 21 and avoiding generation of air gaps between the active areas 21 and the first isolation structures 201, so as to ensure that the active areas 21 have relatively high position accuracy and relatively good electrical performance. In addition, the first isolation structures 201 higher than the top surfaces of the active areas 21 may be used to isolate the active areas 21 from other film layers so that the active areas 21 are selectively electrically connected to bit line structures or capacitor contact holes.

In the present embodiment, the cross section of the active areas 21 is trapezoidal, that is, in the arrangement direction of the active areas 21, the width of the top surfaces of the active areas 21 is less than the width of the bottom surfaces of the active areas 21. In the direction from the top surfaces of the active areas 21 to the bottom surfaces, the width of the active areas 21 in the arrangement direction increases. In this way, it is beneficial to increase the distance between the tops of the adjacent active areas 21 and avoid over-etching of the etching component to expose the adjacent active areas 21.

Correspondingly, since the active areas 21 are trapezoidal, the gaps between the adjacent active areas 21 are inverted trapezoidal, that is, in the direction from the top surfaces of the active areas 21 to the bottom surfaces, the width of the gaps decreases. In some embodiments, since the thickness of the supplementation layer 201b at different positions is equal, the shape of grooves defined by the supplementation layer 201b depends on the shape of the gaps between adjacent active areas 21. If the shape of the gaps is inverted trapezoidal, the shape of the grooves defined by the supplementation layer 201b is also inverted trapezoidal, and the shape of the second isolation structures 202 filling the grooves is also inverted trapezoidal. That is, in the direction from the top surfaces of the first isolation structures 201 to the bottom surfaces of the first isolation structures 201, the width of the second isolation structures 202 in the arrangement direction of the active areas 21 gradually decreases. This is beneficial to increase distances between the bottoms of the adjacent second isolation structures 202, thereby increasing the maximum width of bit line contacts contacting the active areas 21 and improving signal transmission performance of the bit line structures.

Figure 13:
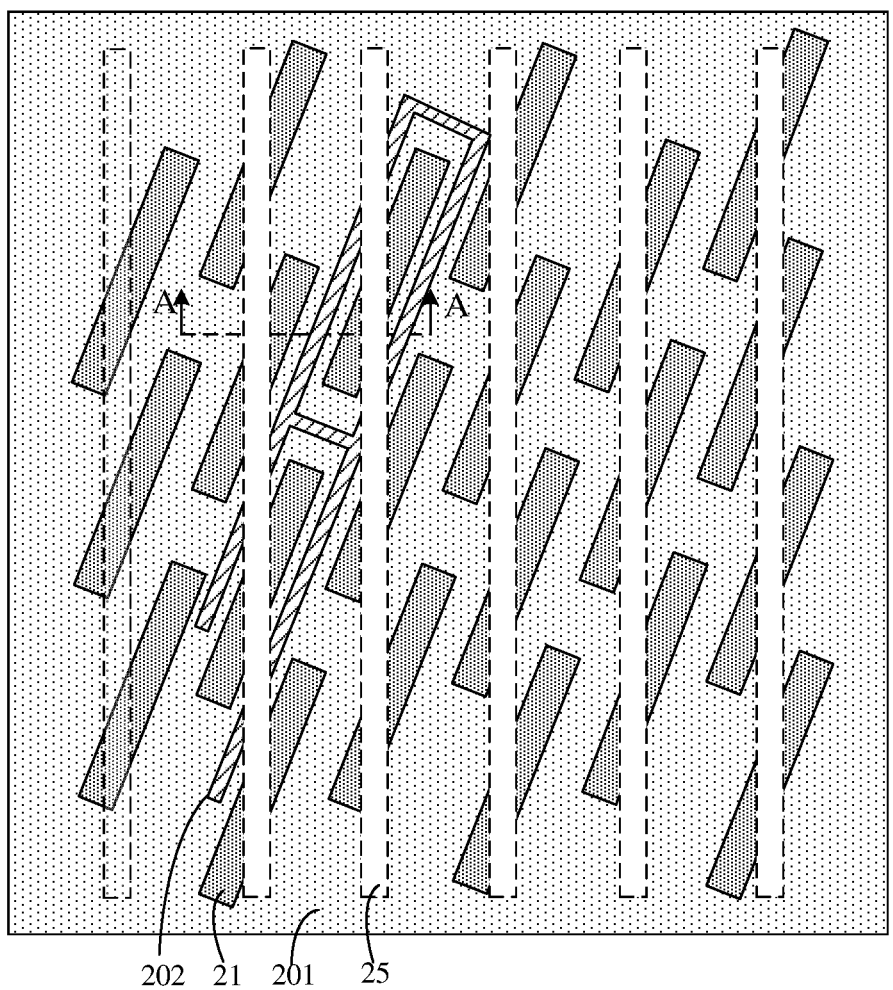

In the present embodiment, referring to FIG. 13, FIG. 13 illustrates positions of part of the second isolation structures 202 and positions of bit line structures 25 to be formed. In a plane where the top surfaces of the active areas 21 are located, an orthographic projection of a second isolation structure 202 surrounds the top surface of an active area 21, that is, any connecting line between adjacent active areas 21 passes through the second isolation structures 202. It should be noted that FIG. 13 only illustrates part of the second isolation structures 202. In fact, the orthographic projections of the second isolation structures 202 surround the top surfaces of each active area 21 and the second isolation structures 202 surrounding each active area 21 respectively form closed loops.

Figure 14:
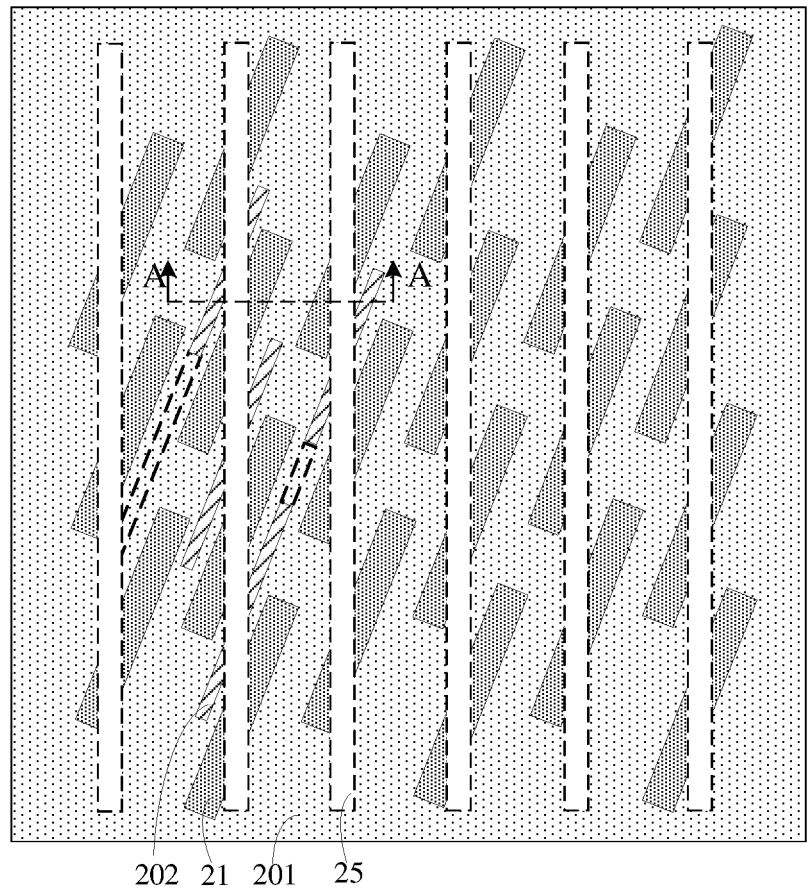

In other embodiments, referring to FIG. 14, the active areas 21 have contact zones electrically connected to the bit line structures 25, and the second isolation structures 202 are located only on the sides of the contact zones. Specifically, the second isolation structures 202 are composed of a plurality of discrete isolation bars. At least two isolation bars are located on the same straight line. At least two isolation bars are parallel to each other. The isolation bars are located at the contact zones between adjacent active areas 21. A length of each isolation bar can be set according to an actual need.

Figure 15:
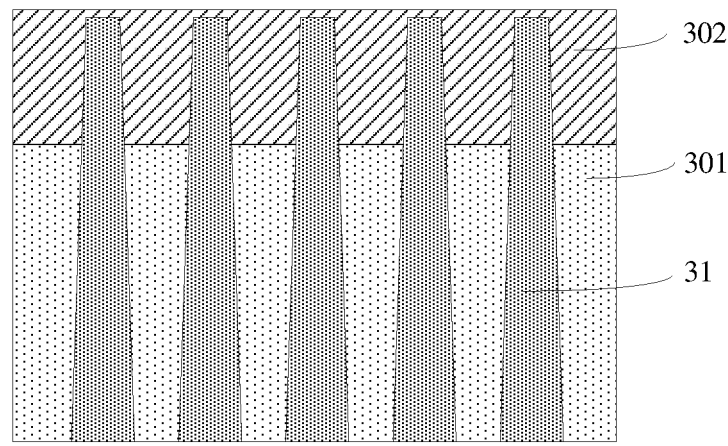

In another embodiment, referring to FIG. 15, the second isolation structures 302 are located on the top surfaces of the first isolation structure 301. The second isolation structures 302 coat the active areas 31. This is beneficial to suppress over-etching in the subsequent etching process for the intermediate grooves and prevent the intermediate grooves from exposing the adjacent active areas 31.

Figure 16:
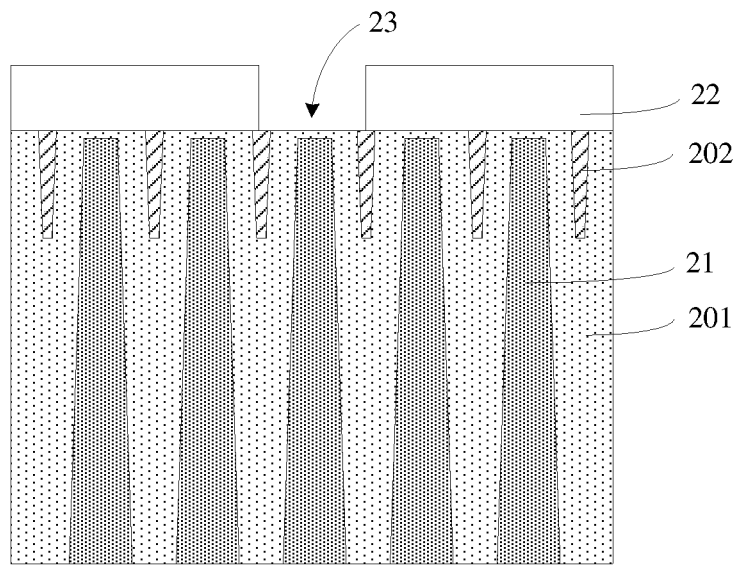

Referring to FIG. 16, a mask layer 22 is formed. The mask layer 22 has a pattern opening 23.

In the plane where the top surfaces of the active areas 21 are located, an active area 21 has a contact zone overlapped with the orthographic projection of the pattern opening 23. The second isolation structures 202 are located at least at two opposite sides of the contact zone. In this way, it is beneficial to prevent the over-etching of the etching component from exposing the adjacent active areas 21. The adjacent active areas 21 include an active area 21 connected to a same bit line structure and an active area 21 connected to a different bit line structure.

Figure 17:
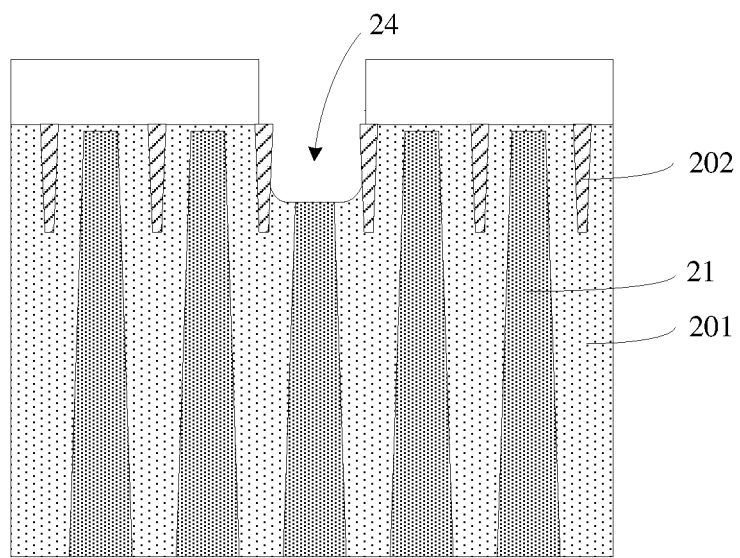

Referring to FIG. 17, an active area 21 and first isolation structures 201 are etched through the pattern opening 23 (referring to FIG. 16) to form an intermediate groove 24.

In the etching process of the intermediate groove 24, the etching component continuously decreases and is accumulated toward the middle. Therefore, the intermediate groove 24 obtained by etching is always wide at the top and narrow at the bottom. In order to ensure that the width of the top surface of the active area 21 exposed by the intermediate groove 24 is greater than or equal to the width of the bit line structure, the width of the pattern opening 23 needs to be greater than the width of the bit line structures. In addition, in order to ensure that the bit line contact is in effective contact with the active area 21, the width of the top surface of the active area 21 exposed by the intermediate groove 24 shall be greater than or equal to the width of the bit line structure. That is, if the width of the bit line structure is greater, the width of the top surface of the active area 21 exposed by the intermediate groove 24 is greater, and the intermediate groove 24 is deeper. In order to ensure that the second isolation structures 202 have relatively good isolation effect, in a direction perpendicular to the top surfaces of the first isolation structures 201, the bottom surfaces of the second isolation structures 202 are lower than or flush with the bottom surfaces of the intermediate grooves 24.

In some embodiments, in the direction perpendicular to the top surfaces of the first isolation structures 201, the thickness of the second isolation structures 202 is 5 nm-7 nm, for example, 5.5 nm, 6 nm, or 6.5 nm.

In the present embodiment, the intermediate grooves 24 expose sidewall surfaces of the second isolation structures 202. Since the concentration of the etching component is relatively high at the initial stage of etching the first isolation structures 201 and the active areas 21, over-etching by the etching component is obvious. Therefore, the top of the second isolation structures 202 may be set to be relatively thick to prevent the etching component from etching through the top surfaces of the second isolation structures 202, so as to prevent the intermediate groove 24 from exposing another adjacent active area 21 and ensure that each bit line structure has good signal transmission performance. In addition, at the later stage of the etching process, when the concentration of the etching component is relatively low, the over-etching of the etching component is relatively weak. Therefore, the bottom of the second isolation structures 202 may be set to be relatively thin, thus increasing the distance between the bottoms of adjacent second isolation structures 202. That is, the width of the bottom surfaces of the bit line contact is increased, and the signal transmission performance of the bit line structures is improved.

The width of the top surfaces of the second isolation structures 202 in the arrangement direction of the active areas 21 is 3 nm-5 nm, for example, 3.5 nm, 4 nm or 4.5 nm. The width of the bottom surfaces of the second isolation structures 202 in the arrangement direction of the active areas 21 is 1 nm-5 nm, for example, 2 nm, 3 nm, or 4 nm.

In the present embodiment, an etching selectivity ratio of the etching component that etches the first isolation structures 201 and the active areas 21 to the material of the first isolation structures 201 and the material of the second isolation structures 202 is greater than 1, and the second isolation structures 202 has a good blockage effect. In some embodiments, the hardness of the material of the second isolation structures 202 is greater than the hardness of the material of the first isolation structures 201. The material of the first isolation structures 201 includes silicon dioxide, and the material of the second isolation structures 202 includes silicon nitride.

In addition, the etching process used to form the intermediate groove 24 may be a dry etching process or a wet etching process. Etching gas in the dry etching process includes $NF_3$, and an etching agent in the wet etching process is a hydrofluoric acid solution.

Figure 18:
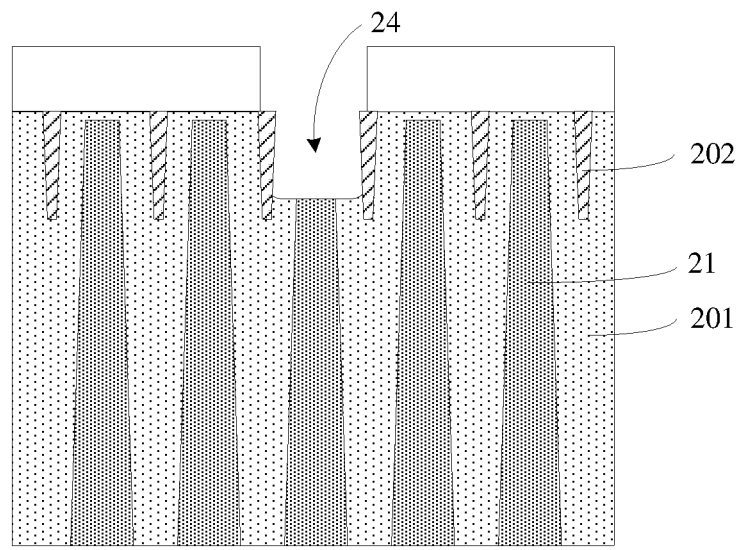

Referring to FIG. 18, the intermediate groove 24 is cleaned.

In the case that the bottom surfaces of the second isolation structures 202 are flush with the bottom surfaces of the intermediate grooves 24, a detergent with relatively low etching capacity is selected for cleaning, which is beneficial to avoid the intermediate grooves 24 from bypassing the second isolation structures 202 and exposing another active area 21 adjacent thereto.

Figure 19:
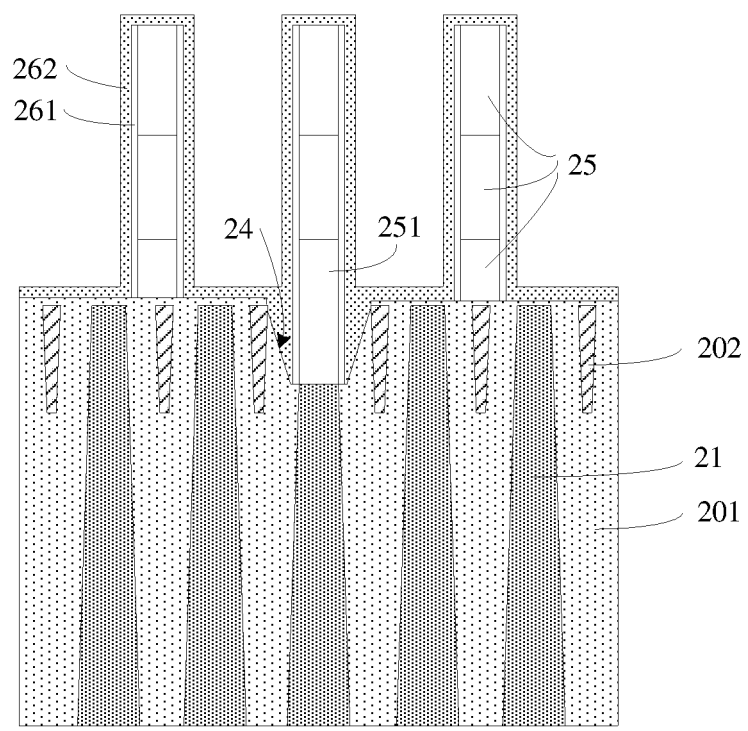

Referring to FIG. 19, the bit line structures 25, an isolation layer, and an intermediate sidewall (not shown) are formed.

Bit line contacts 251 in the bit line structures 25 are in contact with the active areas 21. The isolation layer includes first isolation layers 261 and a second isolation layer 262.

The first isolation layers 261 cover the opposite sidewalls of the bit line structures 25, and the second isolation layer 262 covers the sidewalls of the first isolation layer 261, the top surfaces of the bit line structures 25, the top surfaces of the first isolation structures 201, and the exposed surfaces of the second isolation structures 202. The intermediate sidewalls are located between the adjacent bit line structures 25 to divide trenches between the adjacent bit line structures 25 into a plurality of contact grooves. Each contact groove corresponds to one active area 21.

The hardness of the material of the first isolation layer 261 is less than the hardness of the material of the second isolation layer 262. The material of the first isolation layer 261 includes silicon dioxide or silicon oxynitride. The material of the second isolation layer 262 includes silicon oxynitride or silicon nitride.

Figure 20:
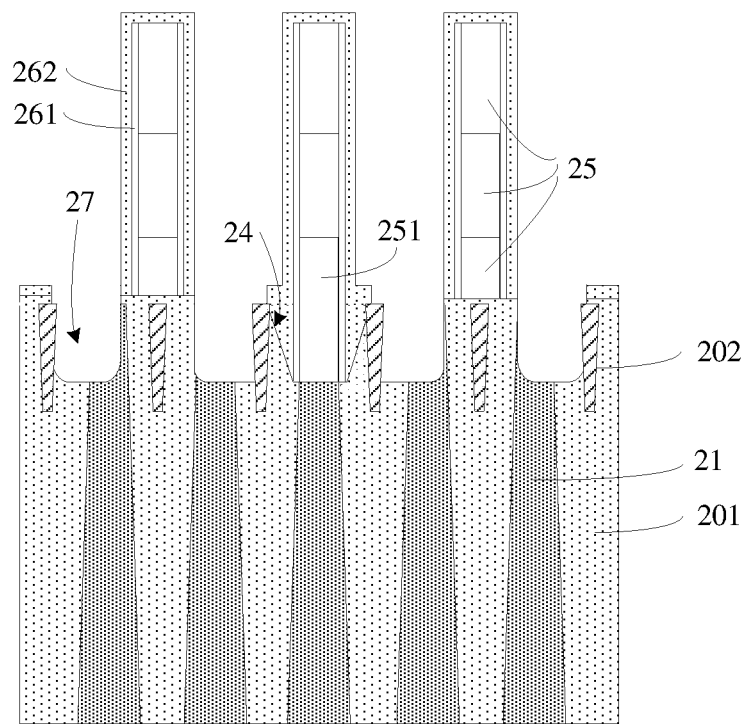

Referring to FIG. 20, the second isolation layer 262, part of the first isolation structures 201, and part of the active areas 21 that are located below the contact grooves are etched to form capacitor contact windows 27 including the contact grooves.

The capacitor contact windows 27 expose part of surfaces of the active areas 21, and the capacitor contact windows 27 are used to fill capacitive contact holes. In order to prevent the capacitor contact windows 27 from bypassing the second isolation structures 202 due to their depth greater than the lowest position of the second isolation structures 202 and exposing the bit line contacts 251 or other active areas 21, the bottom surfaces of the second isolation structures 202 may be set to be lower than or flush with the bottom surfaces of the capacitor contact windows 27.

Similarly, in order to prevent the cleaning process of the capacitor contact windows 27 from further consuming the first isolation structures 201, which causes the capacitor contact windows 27 to expose the bit line contacts 251 or other active areas 21, preferably, the bottom surfaces of the second isolation structures 202 are set to be lower than the bottom surfaces of the capacitor contact windows 27.

In the present embodiment, by the arrangement of the second isolation structures, since the material of the second isolation structures is different from the material of the first isolation structures, when an etching component is used to etch the first isolation structures and the active areas, the second isolation structures may play a blockage role in diffusion of the etching component, thus avoiding exposure of other adjacent active areas due to over-etching by the etching component and in turn avoiding damage to other active areas in the process due to the exposure, thereby improving the electrical performance of the semiconductor structure.

Correspondingly, the embodiments of the present disclosure further provide a semiconductor structure, which can be manufactured using the above-mentioned method for forming a semiconductor structure.

Referring to FIG. 20, the semiconductor structure includes a base, intermediate grooves 24, and bit line structures 25. The base includes active areas 21, first isolation structures 201, and second isolation structures 202. The active areas 21 and the first isolation structures 201 are disposed at intervals. The second isolation structures 202 are located between adjacent active areas 21. Top surfaces of the second isolation structures 202 is higher than or flush with top surfaces of the active areas 21. The intermediate grooves 24 are located in the base, and at least expose part of surfaces of the active areas 21. The second isolation structures 202 are located at two opposite sides of the intermediate grooves 24. The bit line structures 25 are electrically connected to the part of the active areas 21 exposed by the intermediate grooves 24.

An isolation layer (not shown) and an intermediate sidewall (not shown) are included. The isolation layer covers sidewalls of the bit line structures 25. The intermediate sidewalls divide trenches between adjacent bit line structures 25 into a plurality of capacitor contact windows 27. Partial capacitor contact windows 27 are located in the base. The capacitor contact windows 27 expose the surfaces of the active areas 21 and at least part of the sidewalls of the second isolation structures 202.

The present embodiment provides a new semiconductor structure. The first isolation structure and the second isolation structure are used for isolation together to effectively protect an active layer, ensure that the active areas have preset structures and components, and ensure that the semiconductor structure has good performance.

Those of ordinary skill in the art can understand that the above-mentioned implementation modes are specific embodiments for realizing the present disclosure, and in actual applications, various changes can be made in form and details without departing from the spirit and scope of the present disclosure. Any person skilled in the art can make changes and modifications without departing from the spirit and scope of the present disclosure. Therefore, the scope of protection of the present disclosure shall be subject to the scope limited by the claims.

The invention claimed is:

1. A method for forming a semiconductor structure, comprising:
   providing active areas and first isolation structures which are disposed at intervals;
   forming second isolation structures located between adjacent active areas, top surfaces of the second isolation structures being higher than or flush with top surfaces of the active areas;
   forming a mask layer, pattern openings of the mask layer exposing part of the top surfaces of the active areas, and the second isolation structures being located at two opposite sides of part of the active areas;
   etching the part of the active areas exposed by the pattern openings and part of the first isolation structures to form intermediate grooves; and
   forming bit line structures electrically connected to the top surfaces of the active areas exposed by the intermediate grooves.

2. The method for forming the semiconductor structure of claim 1, wherein the second isolation structures are located in the first isolation structures, and the first isolation structures isolate the second isolation structures from the active areas.

3. The method for forming the semiconductor structure of claim 2, wherein forming the first isolation structures and the second isolation structures comprises:
   forming the active areas and initial isolation structures which are disposed at intervals, top surfaces of the initial isolation structures being flush with the top surfaces of the active areas;
   etching partial thickness of the initial isolation structures, so as to expose part of sidewalls of the active areas;
   forming a supplementation layer that covers the sidewalls and the top surfaces of the active areas and the top surfaces of the initial isolation structures, the supplementation layer and a remaining portion of the initial isolation structures constituting the first isolation structures; and
   forming second isolation structures that fill gaps defined by the supplementation layer, the top surfaces of the second isolation structures being flush with top surfaces of the first isolation structures and higher than the top surfaces of the active areas.

4. The method for forming the semiconductor structure of claim 2, wherein in a direction from top surfaces of the first isolation structures to bottom surfaces of the first isolation structures, a width of the second isolation structures in an arrangement direction of the active areas gradually decreases.

5. The method for forming the semiconductor structure of claim 2, wherein a width of the top surfaces of the second isolation structures in an arrangement direction of the active areas is 3 nm-5 nm.

6. The method for forming the semiconductor structure of claim 4, wherein a width of the top surfaces of the second isolation structures in the arrangement direction of the active areas is 3 nm-5 nm.

7. The method for forming the semiconductor structure of claim 2, wherein in a direction perpendicular to top surfaces of the first isolation structures, a thickness of the second isolation structures is 5 nm-7 nm.

8. The method for forming the semiconductor structure of claim 1, further comprising: after forming the bit line structures,
   forming an isolation layer that covers sidewalls of the bit line structures;
   forming intermediate sidewalls that divide trenches between adjacent bit line structures into a plurality of contact grooves; and
   etching part of the active areas located below the contact grooves, so as to form capacitor contact windows containing the contact grooves.

9. The method for forming the semiconductor structure of claim 8, wherein bottom surfaces of the bit line structures are higher than or flush with bottom surfaces of the second isolation structures.

10. The method for forming the semiconductor structure of claim 8, wherein bottom surfaces of the capacitor contact windows are higher than or flush with bottom surfaces of the second isolation structures.

11. The method for forming the semiconductor structure of claim 8, wherein a width of bottom surfaces of the second isolation structures in an arrangement direction of the active areas is 1 nm-5 nm.

12. The method for forming the semiconductor structure of claim 1, wherein a hardness of the second isolation structures is greater than a hardness of the first isolation structures.

13. The method for forming the semiconductor structure of claim 12, wherein a material of the second isolation structures comprises silicon nitride, and a material of the first isolation structures comprises silicon dioxide.

14. The method for forming the semiconductor structure of claim 13, wherein an etching process for forming the intermediate grooves is a dry etching process, and etching gas in the dry etching process is $NF_3$.

* * * * *